United States Patent
Nagoya et al.

[19]

[11] Patent Number: 6,091,305
[45] Date of Patent: Jul. 18, 2000

[54] PLL FREQUENCY SYNTHESIZER

[75] Inventors: Yoshinori Nagoya, Yokohama; Yuji Ishida, Fujisawa; Ken Takei, Hachiouji, all of Japan

[73] Assignee: Hitachi, Ltd., Tokyo, Japan

[21] Appl. No.: 09/369,200

[22] Filed: Aug. 6, 1999

Related U.S. Application Data

[63] Continuation of application No. 08/810,435, Mar. 4, 1997, Pat. No. 5,963,099.

[30] Foreign Application Priority Data

Mar. 15, 1996 [JP] Japan .................................. 8-059173

[51] Int. Cl.[7] ........................................................ H03L 7/00
[52] U.S. Cl. ............................ 331/17; 331/1 A; 327/113; 327/156; 327/157
[58] Field of Search ...................... 331/17, 1 A; 327/156, 327/157, 106, 113

[56] References Cited

U.S. PATENT DOCUMENTS

| | | | |
|---|---|---|---|
| 5,055,803 | 10/1991 | Hietala | 331/17 |
| 5,502,411 | 3/1996 | Matsuki et al. | 331/17 |
| 5,546,052 | 8/1996 | Austin et al. | 331/17 |
| 5,600,272 | 2/1997 | Rogers | 327/113 |

*Primary Examiner*—Son T. Dinh
*Attorney, Agent, or Firm*—Beall Law Offices

[57] ABSTRACT

It is an object of the present invention to reduce the amount of spurious noise generated by an emission line spectrum of a signal propagating around the PLL of a PLL frequency synthesizer carrying out digital-signal processing.

In order to achieve the object described above, the present invention provides a PLL frequency synthesizer with the following configuration.

In a PLL frequency synthesizer having a charge-pump circuit, a waveform converter is provided at a stage behind the charge-pump circuit. The waveform converter converts the voltage waveform on a time axis of a rectangular wave output by the charge-pump circuit into a waveform which: is symmetrical with respect to a predetermined point of time; oscillates so as to have no direct-current component; and has a maximum value of the absolute values of maximums of wave heights thereof located at the center wherein the absolute value decreases uniformly as the wave height is separated farther away from the center. As a result, the amplitudes of a limited number of emission line spectra forming a spurious signal superposed on a signal propagating around the PLL can be made uniform and a maximum thereof can be held at a low value, allowing the direct-current component to be eliminated from the signal propagating around the PLL.

14 Claims, 4 Drawing Sheets

PLL FREQUENCY SYNTHESIZER

This is a continuation application of U.S. Ser. No. 08/810,435, filed Mar. 4, 1997. Now U.S. Pat. No. 5,963,099.

BACKGROUND OF THE INVENTION

The present invention relates to a PLL (Phase-Locked Loop) frequency synthesizer used in, among other apparatuses, a radio telephone. In particular, the present invention relates to a PLL frequency synthesizer having a charge-pump circuit.

With the development of digital-signal processing technologies going on in recent years, there has arrived on the scene a PLL frequency synthesizer which adopts a digital-signal processing technology using rectangular waves in the processing to compare a reference signal with a PLL loop signal wave as a means for controlling the output of a VCO (Voltage Controlled Oscillator). Since a PLL of the PLL frequency synthesizer of this type in principle includes digital-signal processing based on rectangular waves, there are encountered a variety of problems that are not seen in a PLL based on the conventional analog-signal processing. In order to solve these problems, a number of studies of relevant technologies have been conducted.

One of the developed technologies is disclosed in U.S. Pat. No. 5,055,803. According to this technology, ranges of values of device constants of components composing a loop filter of a PLL frequency synthesizer adopting a digital-signal processing technology based on rectangular waves are prescribed in order to improve the stability of the PLL against changes in device sensitivity occurring in the components. To put it in detail, since the configuration of the PLL for carrying out digital-signal processing includes a charge-pump circuit, the degree of a transfer function prescribing the loop gain of the PLL increases by one over that of a transfer function of a PLL for carrying out analog-signal processing, giving rise to a new stability problem.

In the conventional technology described above, a means for controlling a spurious wave generated in a signal wave propagating around the PLL is disclosed. The spurious wave is newly developed as a result of inclusion of digital-signal processing in the PLL.

In the conventional technology described above, however, there is not given any consideration regarding spurious noise generated by an emission line spectrum superposed on a signal wave propagating around the PLL of the PLL frequency synthesizer carrying out digital-signal processing, giving rise to a problem that the amount of spurious noise is not sufficiently reduced.

In the PLL frequency synthesizer carrying out digital-signal processing, the PLL thereof includes an operation to convert time variations of a signal wave into variations in phase. This operation is equivalent to the Fourier transformation for transforming a signal wave from a time axis to a frequency axis. In the PLL frequency synthesizer carrying out digital-signal processing, since digital-signal processing is carried out, a rectangular-wave signal propagates around the PLL in principle. Thus, the Fourier transformation is performed on a rectangular wave. Since the rectangular wave propagating around the PLL has a fixed period, a Fourier transformation for a periodical rectangular wave is carried out in the PLL. Since the Fourier transformation for a rectangular wave exhibiting periodicity with time variations introduces a limited emission line spectrum subject to a frequency-band restriction, in the PLL frequency synthesizer carrying out digital-signal processing, a signal wave propagating around the PLL has the limited emission line spectrum superposed thereon on the frequency axis, giving rise to a problem that the limited emission line spectrum appears as spurious noise.

SUMMARY OF THE INVENTION

It is an object of the present invention to reduce the amount of spurious noise generated by an emission line spectrum of a signal propagating around the PLL of a PLL frequency synthesizer carrying out digital-signal processing.

As described above, in a PLL frequency synthesizer carrying out digital-signal processing, it is necessary to carry out in the PLL digital-signal processing on a rectangular wave exhibiting periodicity. By changing the form of the rectangular wave, the distribution and the shape of an emission line spectrum generated in the PLL can be modified. The emission line spectrum becomes a spurious signal which appears as a noise component in addition to a signal component propagating around the PLL. For this reason, it is thus necessary to suppress the intensity of the spurious signal in order to improve the quality of the signal propagating around the PLL, that is, in order to improve the signal-to-noise characteristic of the PLL frequency synthesizer.

As long as a rectangular wave exhibiting periodicity exists in the PLL, the amount of an emission line spectrum forming a spurious signal is determined by the periodicity and the actual shape of the rectangular wave. Since the periodicity of the rectangular wave is determined by the operating speed and the operating frequency of the PLL frequency synthesizer, it can not be adjusted. By making the rectangular wave more gently-sloping, that is, by converting the shape of the rectangular wave into a sinusoidal shape, the amount of the emission line spectrum can be reduced. The farther the actual shape of the rectangular wave is departed from an ideal rectangle, however, the more the accuracy of the digital-signal processing carried out by the PLL frequency synthesizer carrying out digital-signal processing is deteriorated. Thus, the modification of the shape of the rectangular wave is a trade-off with the performance of PLL frequency synthesizer. As a result, a substantial improvement effect can not be expected.

According to the present invention, by making the amplitudes of a limited number of emission line spectra forming a spurious signal uniform and by holding the maximum value of the emission line spectra at as low a value as possible, the amount of spurious noise generated by the emission line spectra can be substantially suppressed. That is to say, according to the present invention, it has been discovered that, since the statistical signal-to-noise performance displayed in a stable operation of the PLL frequency synthesizer or during the actual use thereof is determined by the maximum value of the spurious signal, by making the amplitudes of a limited number of emission line spectra forming a spurious signal uniform and by holding the maximum value of the emission line spectra at as low a value as possible, the performance displayed by the PLL frequency synthesizer during the actual use thereof can be improved substantially.

A solution means provided by the present invention is described in more concrete terms as follows.

According to the theory of the Fourier transformation, by making a time waveform a sinc function, in a limited frequency band, an equal-amplitude frequency spectrum can be realized. Accordingly, in principle, by making the waveform in one period of a rectangular wave exhibiting periodicity a sinc function, the amplitudes of a limited number of emission line spectra can be made uniform. In comparison with a rectangular wave, however, the rising characteristic of a sinc function is extremely slow, deteriorating the accuracy of the digital-signal processing in the PLL.

In addition, the definition range of a sinc function is infinite, making it impossible to implement a rectangular wave exhibiting periodicity in one period, that is, in a limited definition range. Accordingly, a method of sampling a sinc function in a limited definition range by a rectangular wave is adopted as a technique for making the amplitudes of a limited number of emission line spectra forming a spurious signal as uniform as possible without deteriorating the accuracy of the digital-signal processing in the PLL. If the shape of a rectangular wave is determined by using the sampling method described above, however, the rectangular wave propagating around a PLL after the waveform reshaping includes a direct-current component, everlastingly providing the signal propagating around the PLL with an offset which gives a hindrance to an effort made to increase the speed of the PLL frequency synthesizer. For this reason, the present invention provides a means whereby, after sampling a sinc function in a limited definition range by a rectangular wave, the area of each one-shot rectangular shape of the rectangular wave is adjusted by typically changing the height and the width thereof in order to eliminate the direct-current component of the rectangular wave in the limited definition range described above after the adjustment. To put it concretely, the means is used for making the total area of a set of one-shot rectangles in a negative range with respect to a direct current reference equal to the total area of a set of one-shot rectangles in a positive range.

A sinc function is a function symmetrical with respect to a certain reference as well as a function monotonously decreasing with the absolute value of a variable thereof circuit, a waveform converter is provided at a stage behind the charge-pump circuit.

According to a second aspect of the present invention, in a PLL frequency synthesizer employing a charge-pump circuit and a low-pass filter provided at a stage behind the pump-charge circuit, a waveform converter is provided between the charge-pump circuit and the low-pass filter.

According to a third aspect of the present invention, in the PLL frequency synthesizer according to the first or second aspect of the present invention, the waveform converter carries out waveform conversion so that the waveform of the voltage on the time axis of the charge-pump circuit forms a symmetrical shape with respect to a predetermined point of time.

According to a fourth aspect of the present invention, in the PLL frequency synthesizer according to the third aspect of the present invention, the waveform converter further carries out waveform conversion so that the waveform of the voltage on the time axis of the charge-pump circuit does not include a direct-current component.

According to a fifth aspect of the present invention, in the PLL frequency synthesizer according to the third or fourth aspect of the present invention, the waveform converter further carries out waveform conversion so that the waveform of the voltage on the time axis of the charge-with respect to the reference. For this reason, it is advantageous to implement the means described above as a waveform converting means whereby: a voltage waveform on the time axis of a charge-pump circuit employed in the PLL is converted into a shape symmetrical with respect to a predetermined point of time; the voltage waveform on the time axis of the charge-pump circuit is converted so as not to include a direct-current component; the voltage waveform on the time axis of the charge-pump circuit is of an oscillatory type; and the voltage waveform on the time axis of the charge-pump circuit is a waveform wherein the absolute values of the maximums of the wave heights have a maximum value located at the center and decrease uniformly as the wave height is separated farther away from the center.

As a result, the amplitudes of a limited number of emission line spectra can be made uniform and the maximum value of the emission line spectra can be held at as low a value as possible, allowing the performance of the PLL frequency synthesizer displayed during the actual use to be improved substantially.

Aspects of the present invention are listed in a more concrete form as follows.

According to a first aspect of the present invention, in a PLL frequency synthesizer employing a charge-pump pump circuit is of an oscillatory type.

According to a sixth aspect of the present invention, in the PLL frequency synthesizer according to the fifth aspect of the present invention, the waveform converter further carries out waveform conversion so that the waveform of the voltage on the time axis of the charge-pump circuit is a waveform wherein the absolute values of the maximums of the wave heights have a maximum value located at the center and decrease uniformly as the wave height is separated farther away from the center.

According to a seventh aspect of the present invention, in the PLL frequency synthesizer according to the fifth or sixth aspect of the present invention, the waveform converter further carries out waveform conversion so that the number of maximum values of the waveform of the voltage on the time axis of the charge-pump circuit is five or smaller.

BRIEF DESCRIPTION OF THE DRAWINGS

Preferred embodiments of the present invention will now be described in conjunction with accompanying drawings shown in the following figures wherein.

DESCRIPTION OF THE PREFERRED EMBODIMENTS

The present invention will become more apparent from the following detailed description of preferred embodiments with reference to the accompanying diagrams showing the embodiments.

Figure 1:
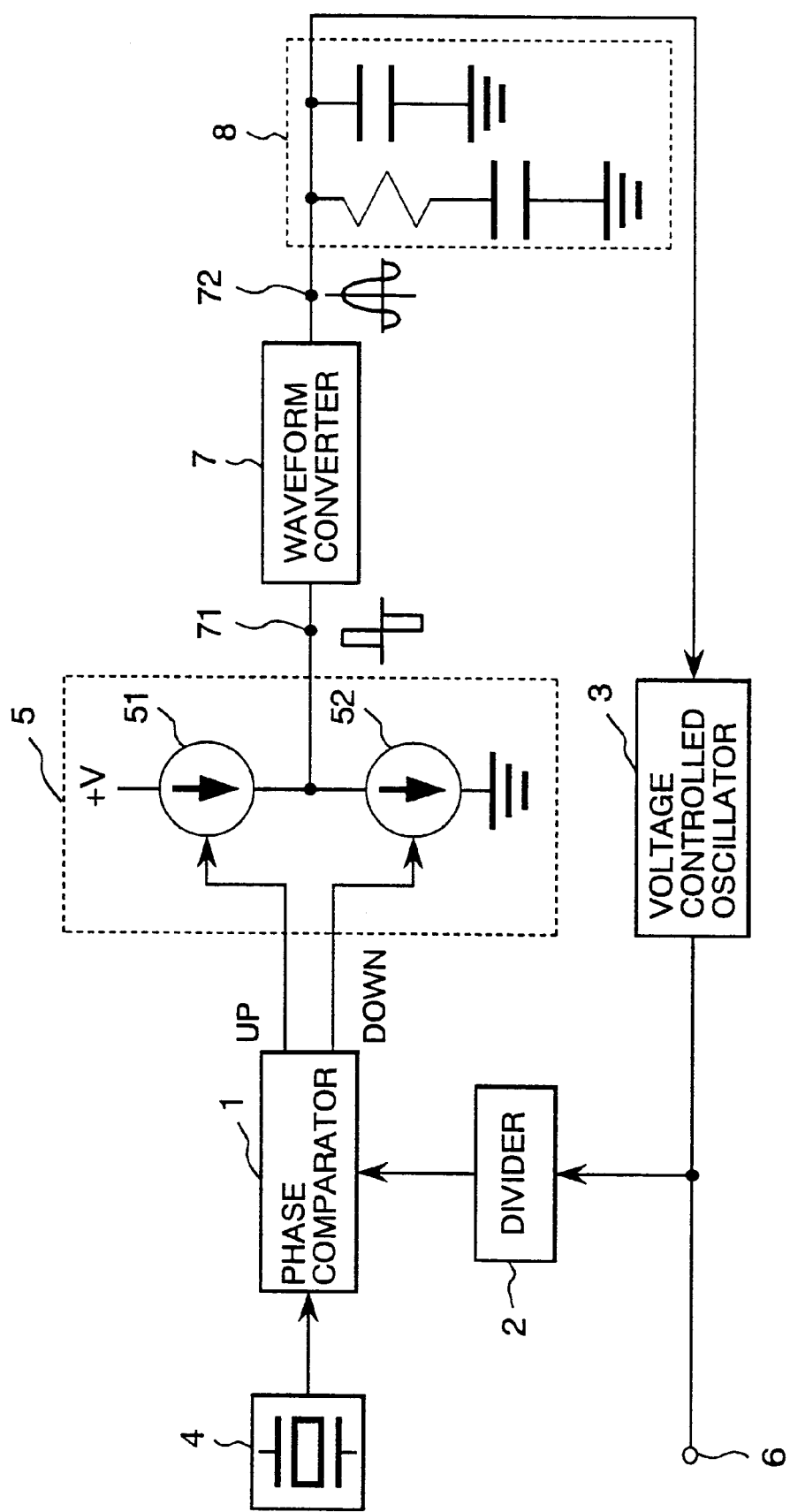
FIG. 1 is a block diagram showing the configuration of a PLL frequency synthesizer provided by an embodiment of the present invention.

FIG. 1 is a block diagram showing the configuration of a PLL frequency synthesizer provided by an embodiment of the present invention. As shown in the figure, two signals UP and DOWN output by a phase comparator 1 which uses a signal output by a reference-signal generator 4 as a reference serve as control signals to turn on and off current sources 51 and 52 respectively. The current sources 51 and 52 constitute a charge-pump circuit 5. A rectangular-wave output 71 created by the charge-pump circuit 5 is supplied to a waveform converter 7 for carrying out waveform conversion. After the waveform of the rectangular-wave output 71 has been converted into an output waveform 72 in accordance with the present invention, it is supplied to a loop filter 8. A signal output by the loop filter 8 is used as a control signal of a voltage controlled oscillator 3. A signal output by the voltage controlled oscillator 3 is supplied to the input of a phase comparator 1 by way of a frequency divider 2. The signal output by the voltage controlled oscillator 3 is compared with a signal output by the reference-signal generator 4. A frequency resulted in by a PLL closed-loop circuit is extracted from the output of the voltage controlled oscillator 3 and used as a synthesizer output 6. In the configuration described above, a feature of the present invention lies in the waveform changing function carried out by waveform converter 7. For this reason, an embodiment implementing the waveform converter 7 is explained in a concrete form as follows.

Figure 2:
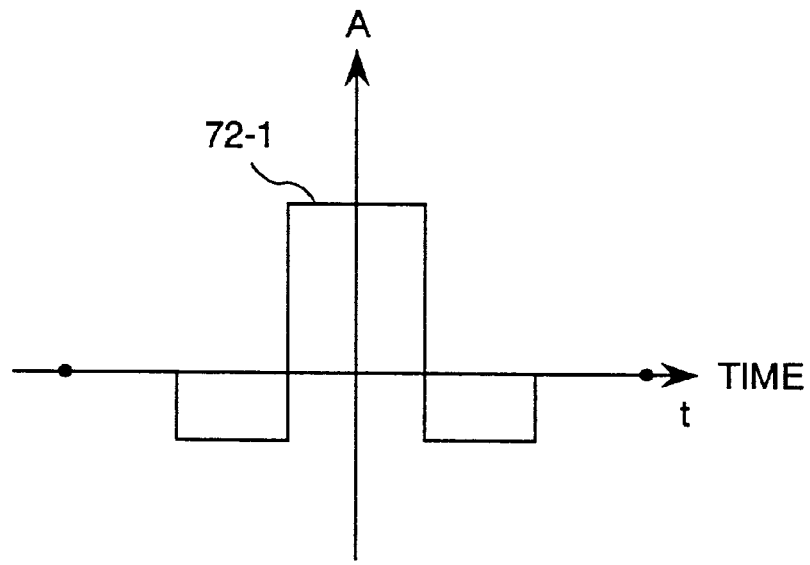
FIG. 2 is a waveform diagram showing the time-axis waveform of a signal output by a first embodiment implementing a waveform converter employed in the PLL frequency synthesizer shown in FIG. 1.

FIG. 2 is a waveform diagram showing the time-axis waveform 72-1 of a signal output by a first embodiment implementing the waveform converter 7 employed in the PLL frequency synthesizer shown in FIG. 1. As shown in the figure, the time-axis waveform 72-1 is symmetrical with respect to a time axis of symmetry A and the amplitude thereof is attenuated monotonously as the amplitude is separated farther away from the time axis of symmetry A. In addition, the total area of the rectangular wave in the negative region with respect to the reference axis t of the amplitude is equal to the total area of the rectangular wave in the positive region. According to the present embodiment, since the signal output by the waveform converter 7 does not include a direct-current component, the direct-current potential of the PLL does not change. Accordingly, as a PLL frequency synthesizer, a high-speed operation thereof can be implemented. In addition, since the signal output by the waveform converter 7 is close to a sinc function in comparison with a rectangular wave with a fixed amplitude, the amplitudes of a limited number of emission line spectra forming a spurious signal generated in the PLL can be adjusted to an all but uniform shape. As a result, the present invention has an effect of improving the statistical signal-to-noise ratio in a stable operation of the PLL frequency synthesizer or during the actual use thereof.

Figure 3:
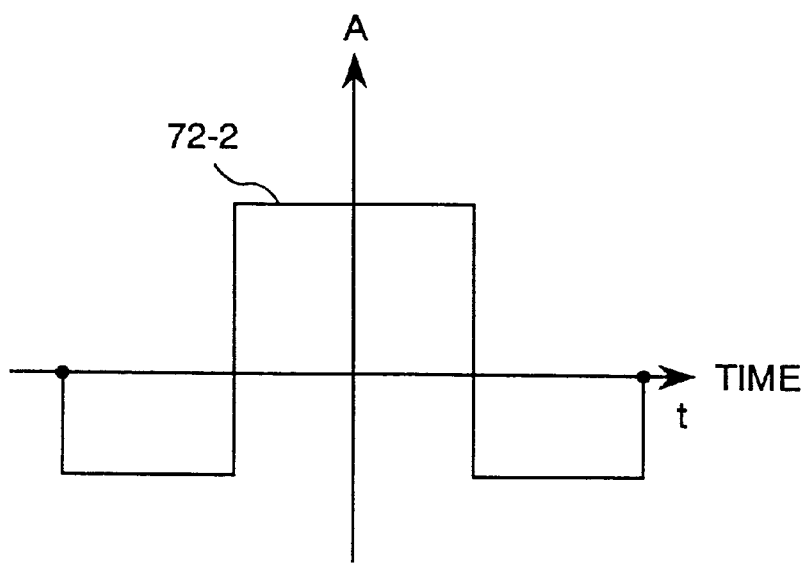
FIG. 3 is a waveform diagram showing the time-axis waveform of a signal output by a second embodiment implementing a waveform converter employed in the PLL frequency synthesizer shown in FIG. 1.

FIG. 3 is a waveform diagram showing the time-axis waveform 72-2 of a signal output by a second embodiment implementing the waveform converter 7 employed in the PLL frequency synthesizer shown in FIG. 1. The second embodiment is different from the first embodiment shown in FIG. 2 in that the waveform converter 7 provided by the second embodiment continuously outputs a non-zero output over a period of the rectangular wave with periodicity propagating around the PLL, a period corresponding to a time between two black points shown in FIGS. 2 through 5. According to the PLL frequency synthesizer provided by the present embodiment, high-frequency components of a limited number of emission line spectra forming a spurious signal generated by a Fourier transformation effect of the PLL are suppressed in comparison with the first embodiment. As a result, when the PLL frequency synthesizer having the waveform converter 7 provided by the second embodiment is used at a location in close proximity to another high-frequency circuit, an effect of reducing the number of unnecessary signals leaking to the other high-frequency circuit is realized.

Figure 4:
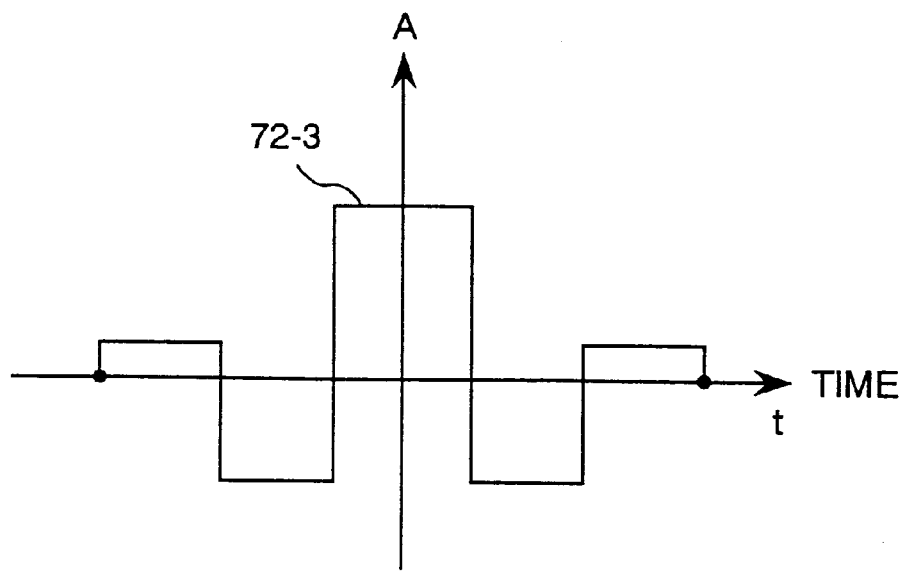
FIG. 4 is a waveform diagram showing the time-axis waveform of a signal output by a third embodiment implementing a waveform converter employed in the PLL frequency synthesizer shown in FIG. 1.

FIG. 4 is a waveform diagram showing the time-axis waveform 72-3 of a signal output by a third embodiment implementing the waveform converter 7 employed in the PLL frequency synthesizer shown in FIG. 1. The waveform converter 7 is different from the first embodiment shown in FIG. 2 in that the time-axis waveform 72-3 output by the waveform converter 7 resembles a sinc function more than the output of the first embodiment does. According to the present embodiment, the amplitudes of a limited number of emission line spectra forming a spurious signal generated in the PLL can be adjusted to an all but uniform shape. As a result, the maximum amplitudes of the emission line spectra can be reduced, resulting in an effect of improving the statistical signal-to-noise performance in a stable operation of the PLL frequency synthesizer or during the actual use thereof.

Figure 5:
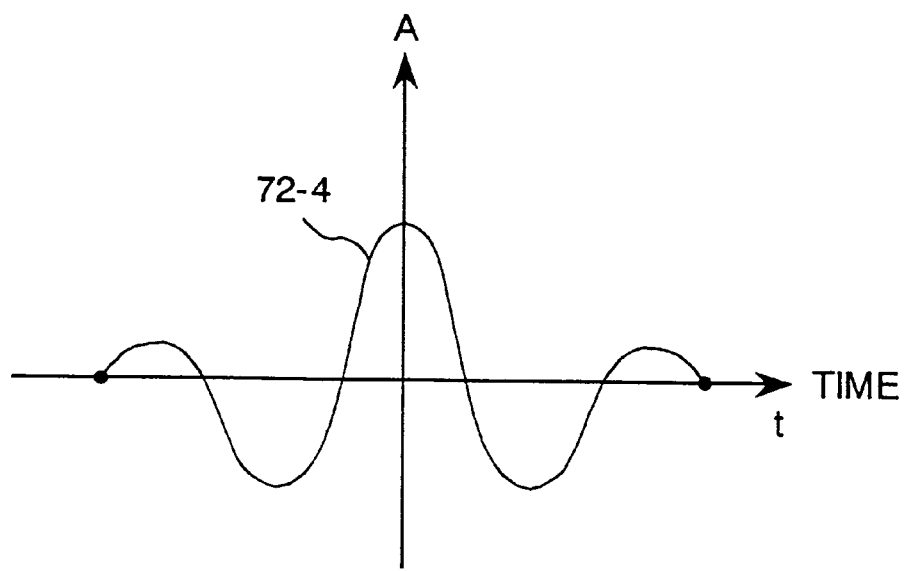
FIG. 5 is a waveform diagram showing the time-axis waveform of a signal output by a fourth embodiment implementing a waveform converter employed in the PLL frequency synthesizer shown in FIG. 1.

FIG. 5 is a waveform diagram showing the time-axis waveform 72-4 of a signal output by a fourth embodiment implementing a waveform converter 7 employed in the PLL frequency synthesizer shown in FIG. 1. As shown in the figure, the time-axis waveform 72-4 is symmetrical with respect to a time axis of symmetry A and the amplitude thereof is attenuated monotonously as the amplitude is separated farther away from the time axis of symmetry A. In addition, the total area of the rectangular wave in the negative region with respect to the reference axis t of the amplitude is equal to the total area of the rectangular wave in the positive region. According to the present embodiment, since the signal output by the waveform converter 7 does not include a direct-current component, the direct-current potential of the PLL does not change. Accordingly, as a PLL frequency synthesizer, a high-speed operation thereof can be implemented. In addition, since the signal output by the waveform converter 7 is close to a sinc function in comparison with a rectangular wave with a fixed amplitude and local changes in waveform amplitude are small, the amplitudes of a limited number of emission line spectra forming a spurious signal generated in the PLL can be adjusted to an all but uniform shape and the limited number of emission line spectra forming a spurious signal generated by the Fourier transformation effect of the PLL is reduced. As a result, the statistical signal-to-noise performance in a stable operation of the PLL frequency synthesizer or during the actual use thereof can be improved well in comparison with the first embodiment.

It should be noted that since the waveform of a signal propagating around the PLL in the fourth embodiment shown in FIG. 5 is different from that of a rectangular wave, the accuracy of the digital-signal processing is degraded to a certain degree. Because the accuracy of the digital-signal processing is dependent upon the steepness of the rising and falling characteristics of the waveform in use, it is desirable to set the differential coefficients of the rising and falling edges of the waveform shown in FIG. 5 at values of sufficient slowness that does not sacrifice the accuracy of the digital-signal processing required by a circuit or a system employing the PLL waveform converter provided by the present embodiment.

Figure 6:
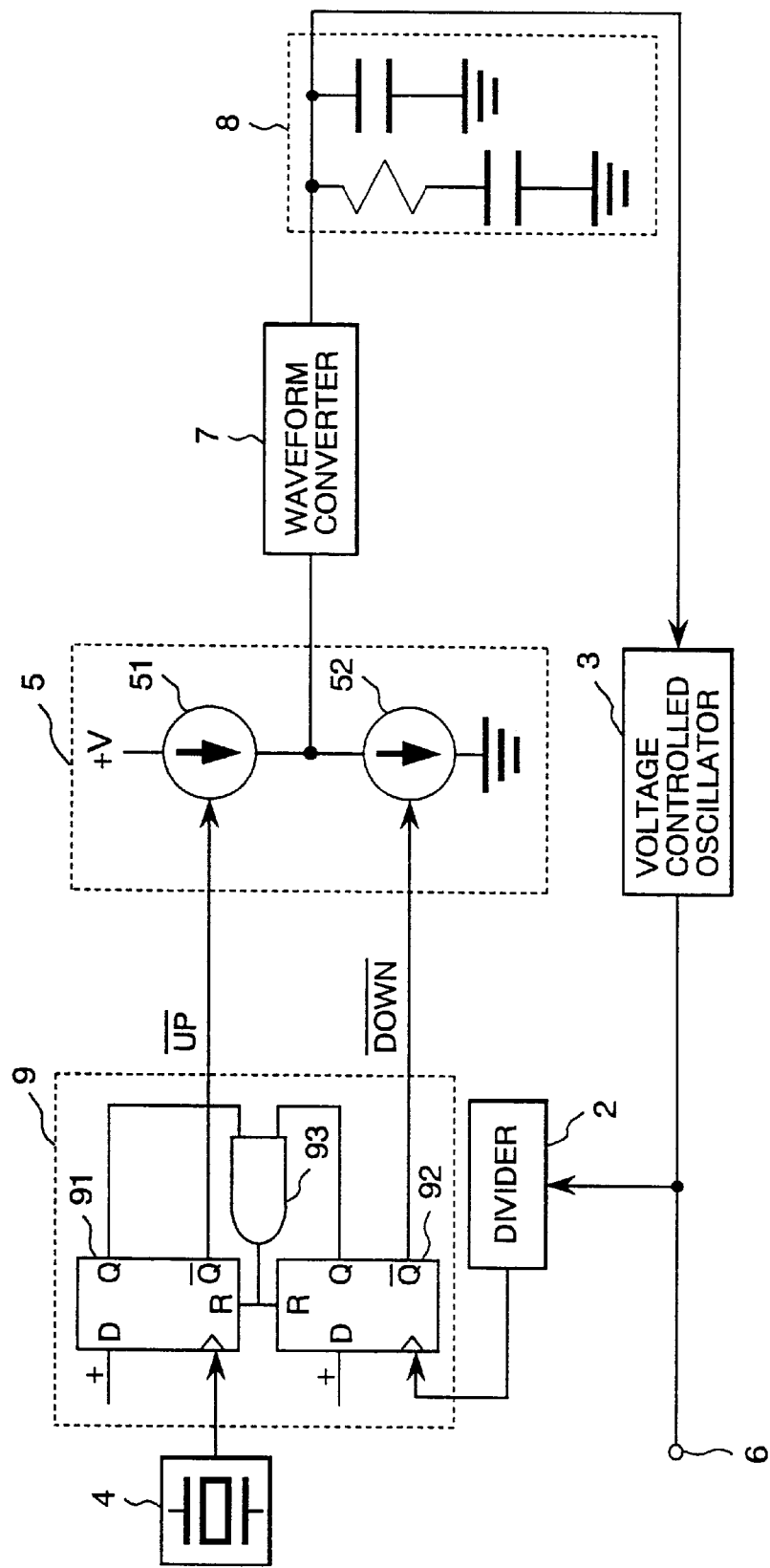
FIG. 6 is a block diagram showing the configuration of a PLL frequency synthesizer provided by another embodiment of the present invention.

FIG. 6 is a block diagram showing the configuration of a PLL frequency synthesizer provided by another embodiment of the present invention. In the configuration of the PLL frequency synthesizer provided by the embodiment shown in FIG. 6, the phase converter 1 comprises two D/Q flip-flops 91 and 92. The D input of each of the D/Q flip-flops 91 and 92 is sustained at a high level. The two D/Q flip-flops 91 and 92 have a common reference R. The input of the first D/Q flip-flop 91 is connected to the output of the reference-signal generator 4. On the other hand, the input of the second D/Q flip-flop 92 is connected to the output of a frequency divider 2. The Q outputs of the D/Q flip-flops 91 and 92 are connected to the inputs of an AND circuit 93, the output of which is connected to the common reference R. The $\overline{Q}$ output of the first D/Q flip-flop 91 is used as an on/off control signal of a first current supply 51 which is sustained at a high power supply. On the other hand, the $\overline{Q}$ output of the second D/Q flip-flop 92 is used as an on/off control signal of a second current supply 52 which is connected to the ground. The first and second current supplies 51 and 52 form a charge-pump circuit 5.

The embodiment shown in FIG. 6 allows processing to compare phases required in a PLL operation to be carried out by using a digital circuit, giving rise to an effect of making the implementation of the PLL frequency synthesizer provided by the present invention by an LSI easy.

According to the present invention, in a PLL frequency synthesizer carrying out digital-signal processing, the amplitudes of a limited number of emission line spectra forming a spurious signal superposed on a signal propagating around the PLL can be made uniform, allowing the maximum of the emission line spectra to be held at as low a value as possible. In addition, the direct-current component of the signal propagating around the PLL can be eliminated. As a result, the signal-to-noise characteristic observed during the actual use of the PLL frequency synthesizer can be improved. Further, the phase-locked characteristic of the PLL can be prevented from deteriorating due to the building-up of the direct-current potential and, in addition, the high-speed operation of the PLL can be implemented.

What is claimed is:

1. A PLL frequency synthesizer, comprising:
   a charge-pump circuit; and
   a waveform converter provided at a stage after an output of said charge-pump circuit;
   wherein said waveform converter carries out waveform conversion so that a waveform of said charge-pump circuit forms a close shape of sinc function.

2. A PLL frequency synthesizer, comprising:
   a charge-pump circuit;
   a low-pass filter provided at a stage behind said charge-pump circuit; and
   a waveform converter provided between said charge-pump circuit and said low-pass filter;
   wherein said waveform converter carries out waveform conversion so that a waveform of said charge-pump circuit forms a close shape of sinc function.

3. A PLL frequency synthesizer comprising:
   a charge-pump circuit;
   a waveform converter provided at a stage after an output of said charge-pump circuit;
   a low-pass filter provided at a stage after an output of said charge-pump circuit;
   a low-pass filter provided at a stage behind said charge-pump circuit;
   a voltage controlled oscillator provided at a stage behind said low-pass filter;
   a divider provided at a stage behind said voltage controlled oscillator; and
   a phase comparator provided between said charge-pump circuit and said divider.

4. The PLL frequency synthesizer according to claim 3, wherein said waveform converter carries out waveform conversion so that a waveform of said charge-pump circuit forms a close shape of sinc function.

5. The PLL frequency synthesizer according to claim 4, wherein said waveform converter further carries out waveform conversion so that a voltage waveform on a time axis of said charge-pump circuit forms a symmetrical shape with respect to a predetermined point of time.

6. The PLL frequency synthesizer according to claim 5, wherein said waveform charge-pump circuit does not include a direct-current component.

7. The PLL frequency synthesizer according to claim 5, wherein said waveform converter further carries out waveform conversion so that a voltage waveform on a time axis of said charge-pump circuit is of an oscillatory type.

8. The PLL frequency synthesizer according to claim 6, wherein said waveform converter further carries out waveform conversion so that a voltage waveform on a time axis of said charge-pump circuit is of an oscillatory type.

9. The PLL frequency synthesizer according to claim 7, wherein said waveform converter further carries out waveform conversion so that a voltage waveform on a time axis of said charge-pump circuit is a waveform, the absolute values of maximums of wave heights of which have a maximum value located at the center and decrease uniformly as said wave height is separated farther away from said center.

10. The PLL frequency synthesizer according to claim 8, wherein said waveform converter further carries out waveform conversion so that a voltage waveform on a time axis of said charge-pump circuit is a waveform, the absolute values of maximums of wave heights of which have a maximum value located at the center and decrease uniformly as said wave height is separated farther away from said center.

11. The PLL frequency synthesizer according to claim 7, wherein said waveform converter further carries out waveform conversion so that the number of maximum values of said voltage waveform on a time axis of said charge-pump circuit is five or smaller.

12. The PLL frequency synthesizer according to claim 8, wherein said waveform converter further carries our waveform conversion so that the number of maximum values of a voltage waveform on a time axis of said charge pump circuit is five or smaller.

13. The PLL frequency synthesizer according to claim 9, wherein said waveform converter further carries out waveform conversion so that the number of maximum values of a voltage waveform on a time axis of said charge-pump circuit is five or smaller.

14. The PLL frequency synthesizer according to claim 10, wherein said waveform converter further carries out waveform conversion so that the number of maximum values of a voltage waveform on a time axis of said charge-pump circuit is five or smaller.

* * * * *